OSCILLATOR WITH PHASE SYNCHRONIZATION

Filed Dec. 20, 1963

INVENTOR
JOHN S. CHOMICKI
BY John J. Goodwin
ATTORNEY 3,245,003

OSCILLATOR WITH PHASE SYNCHRONIZATION

John S. Chomicki, East Fishkill, N.Y., assignor to International Business Machines Corporation, New York, N.Y., a corporation of New York Filed Dec. 20, 1963, Ser. No. 332,016
2 Claims. (Cl. 331—113)

The present invention relates to oscillator circuits and more particularly to a circuit for synchronizing a free-running oscillator.

Free-running relaxation oscillators such as multivibrators are widely used as sources of sequentially occurring pulses spaced at given time intervals. Due to environmental conditions the output pulses from the oscillator may vary or drift, and when this occurs, it becomes necessary to resynchronize the oscillator with an accurate synchronizing pulse.

The adjustment of an oscillator output by means of a synchronizing pulse presents some problems in that it cannot be predetermined, the oscillator being out of synchronism, what the time relationship between the oscillator output signal and the synchronizing signal will be, and it cannot be predetermined which of the two switching devices normally included in an oscillator is operative during the occurrence of the synchronizing pulse.

In the present invention a system for synchronizing an oscillator is shown which is simple and unique, and which serves to overcome the aforesaid and other problems usually associated with the adjusting of oscillators by synchronizing pulses.

An object of the present invention is to provide an improved system for synchronizing oscillators.

Another object of the present invention is to provide a system for synchronizing an oscillator regardless of whether the oscillator is producing an output pulse or not at the time of synchronization.

A further object of the present invention is to provide a system for synchronizing an oscillator wherein the oscillator will be resynchronized with the proper phase.

A feature of the present invention is the provision of a system for synchronizing an oscillator wherein a synchronizing pulse is employed to both synchronize the timing of the oscillator and to insure that the oscillator is synchronized in proper phase.

The foregoing and other objects, features and advantages of the invention will be apparent from the following more particular description of a preferred embodiment of the invention, as illustrated in the accompanying drawings.

Figure 1:
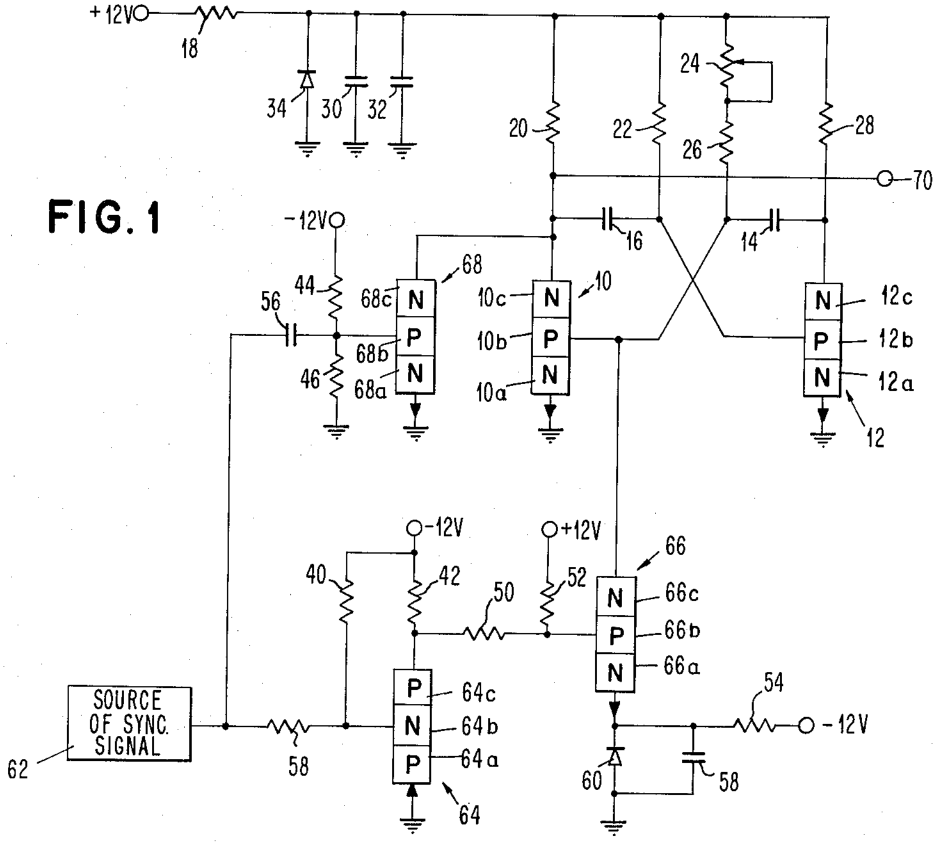
FIG. 1 is a detailed schematic diagram of an embodiment of an oscillator synchronizing system in accordance with the principles of the present invention.

Referring to FIG. 1, a circuit is shown including a conventional astable multivibrator having transistors 10 and 12 with the base **10*b* of transistor 10 being connected to the collector 12*c* of transistor 12 via a capacitor 14, and the base 12*b* of transistor 12 being connected to the collector 10*c* of transistor 10 via a capacitor 16. The bases and collectors of the NPN connected transistors 10 and 12 are suitably biased through a network consisting of resistors 18, 20, 22, 24, 26, and 28, capacitors 30 and 32, and diode 34**, which is in turn connected to a +12 volt potential source not shown. The other active circuit elements in FIG. 1 are similar to various resistors, capacitors, and diodes, either for biasing or coupling purposes, and these will not be particularly described since they are not part of the conceptual aspect of the invention. In the interest of completeness however, all the elements of FIG. 1 will be given reference numbers and suitable values for each will be set forth in a table provided hereinafter.

Also included in FIG. 1 is a source of synchronizing signal 62 which is connected to base **64*b* of transistor inverter 64 via a resistor 38. The collector 64*c* of transistor 64 is connected to base 66*b* of transistor 66 via a resistor 50 and the collector 66*c* of transistor 66 is connected directly to the base 10*b* of multivibrator transistor 10. Synchronizing signal source 62 is also connected to the base 68*b* of pulse shaping transistor 68 via a capacitor 56. The collector 68*c* of transistor 68 is connected directly to the collector 10*c* of multivibrator transistor 10. The collector 10*c* of multivibrator transistor 10 is connected to an output terminal 70 so that the collector potential of transistor 10** will serve as the multivibrator output signal.

Figure 2:
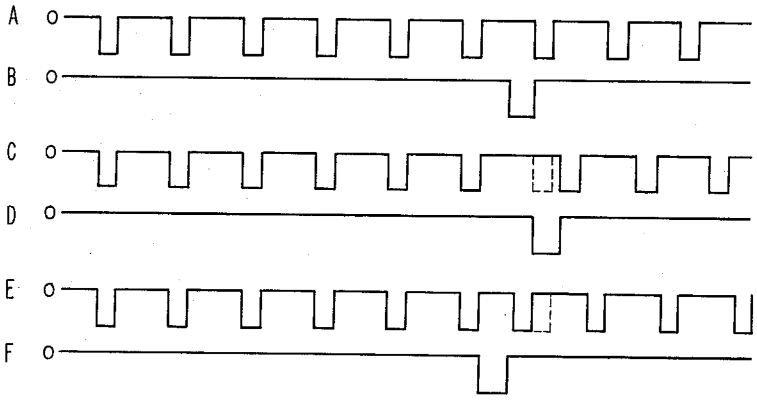
FIG. 2 is an illustration of several waveforms useful in explaining the operation of FIG. 1.

Referring to FIG. 2, waveforms are illustrated which show the possible relationships between the output signal of the multivibrator and the synchronizing signal of the source 62 of FIG. 1. In FIG. 2, waveform A represents the multivibrator output signal and waveform B represents the synchronizing signal for the case when the multivibrator is in synchronism and the synchronizing pulse immediately precedes the multivibrator output pulse. Waveform C represents the multivibrator output signal and waveform D represents the synchronizing signal for the case when the multivibrator is not in synchronism and the multivibrator output pulse occurs at the same time as the synchronizing pulse. Waveform E represents the multivibrator output signal and waveform F represents the synchronizing signal for the case when the multivibrator is not in synchronism and the multivibrator output pulse occurs sometime after the synchronizing pulse. In waveforms C and E the dotted portion represents the place where the multivibrator pulse should have occurred if the multivibrator was synchronized.

By conventional methods the condition represented by waveforms C and D could be corrected, for example, by gating the multivibrator output signal with the synchronizing pulse. This, however, would not be sufficient if the condition represented by waveforms E and F were to occur. Likewise, the condition as represented by waveforms E and F could be corrected by the insertion of a start pulse into the multivibrator, however, this would not correct for the condition as represented by waveforms C and D. What is desired is that the multivibrator output signal, when synchronized, will always occur at the same time with respect to the synchronizing pulse, and further, that such synchronization will occur regardless of the time relationship of the multivibrator output signal and the synchronizing pulse prior to synchronization. The present invention, as embodied in FIG. 1, provides for such synchronization. In FIG. 1, when the synchronizing pulse occurs, the multivibrator is stopped by the synchronizing pulse which causes the base of transistor 10 to become clamped. At the same time the synchronizing pulse is also applied to the collector of transistor 10 so that at the end of the synchronizing pulse the multivibrator is restarted with transistor 10 conducting. The manner in which this is accomplished will now be described in detail with respect to FIG. 1.

In FIG. 1, transistors 10 and 12 are the active elements of an astable oscillator (multivibrator). Initially, that is, when power is first turned on, both transistors 10 and 12 try to conduct, but not being identical transistors, one will conduct harder. Presume that transistor 12 conducts harder. Transistor 12 conducting harder will cause the potential of collector **12*c* to swing in a negative direction toward ground faster than the potential of collector 10*c* of transistor 10. The negative going shift of the potential of collector 12***c* is coupled to base 10*b* of transistor 10 forcing transistor 10 to decrease conduction until transistor 10 is cut off and transistor 12 is saturated. The negative potential of base 10*b* then begins to discharge through capacitor 14 and the potential of base 10*b* now begins to increase exponentially to a positive voltage according to the time constant of capacitor 14 and resistors 24 and 26. When base 10*b* goes positive, transistor 10 begins to conduct and the potential of its collector 10*c* swings in a negative direction to ground. The negative shaft of the potential of collector 10*c* is coupled to the base 12*b* of saturated transistor 12 and causes transistor 12 to cut-off, making the potential of its collector 12*c* go in a positive direction. The positive shift of the potential collector 12*c* is coupled to base 10*b* making transistor 10 conduct harder until it becomes saturated. The negative voltage at base 12*b* then discharges through capacitor 16 and the potential of base 12*b* increases exponentially to a positive value according to the time constant of capacitor 16 and transistor 22. The positive voltage of base 12*b* then causes transistor 12 to begin to conduct, the potential of collector 12*c* goes in a negative direction and cuts off transistor 10 and the cycle continues. The operation described thus far is the conventional multivibrator operation, with the negative going shifts of collector 10*c* being utilized as the output signals.

As previously stated, the multivibrator must be occasionally resynchronized by an accurate synchronizing pulse. This pulse is provided by source of synchronizing signals 62 and is a negative going pulse as depicted in FIG. 2.

The synchronizing pulse is applied to the base 64*b* of PNP transistor 64 which is normally biased off. The synchronizing pulse turns transistor 64 on and it stays on for the duration of the synchronizing pulse. The potential of collector 64*c* therefore increases positively from a negative level to ground level. The positive potential increase of collector 64*c* is applied to the base 66*b* of normally off NPN transistor 66, thereby turning transistor 66 on. Transistor 66 saturates and the potential of collector 66*c* thereof becomes slightly negative. If transistor 10 happened to be on when the synchronizing pulse occurred, the saturated transistor 66 provides a discharge path to ground for capacitor 14 so that transistor 10 is turned off. Transistor 10 is maintained in the off condition for the duration of the synchronizing pulse by the fact that the negative potential of collector 66*c* is coupled to the base 10*b*, thereby providing an effective negative clamp for transistor 10, and the collector potential of collector 10*c* applied to output terminal 70 stays at zero.

The restarting of the multivibrator is also controlled by the synchronizing pulse. The synchronizing pulse from source 62 is applied to the base 68*b* of transistor which is a normally off NPN transistor. At the end of the synchronizing pulse, the positive going potential change of the trailing edge of the pulse turns transistor 68 on. The potential of collector 68*c* of transistor 68 then swings in a negative direction. The collector 68*c* is connected directly to collector 10*c* of transistor 10 and to output terminal 70. The potential of output terminal 70 therefore becomes negative at the instant that the synchronizing pulse ceases. This is the desired condition as depicted by waveforms A and B in FIG. 2. The negative potential change applied from collector 68*c* to collector 10*c* is also connected to base 12*b* of transistor 12 via capacitor 16. Transistor 12 therefore turns off. The synchronizing pulse having ceased, transistors 64 and 66 go off and transistor 10 is no longer clamped and is permitted to turn on in the normal multivibrator manner, thus taking over as the source of multivibrator output signal. Thus the multivibrator is synchronized with the pulse from source 62. Not only does the output signal of the multivibrator always commence at the end of the synchronizing pulse, but it is always known that the operation will begin with transistor 10 on.

In order to enable one skilled in the art to practice the present invention, typical values for the circuit elements of FIG. 1 are set forth in Table I. It is to be understood, however, that the scope of the present invention is not limited to the specific circuit shown in FIG. 1.

*Table I*

| | |
|---|---|
| Resistor **18** | 200 ohms. |
| Resistor **20** | 510 ohms. |
| Resistor **22** | 10K ohms. |
| Resistor **24** | 20K ohms. |
| Resistor **26** | 16K ohms. |
| Resistor **28** | 510 ohms. |
| Capacitor **30** | 100 μf. |
| Capacitor **32** | .001 μf. |
| Resistor **38** | 4.3K ohms. |
| Resistor **40** | 24K ohms. |
| Resistor **42** | 1.5K ohms. |
| Resistor **44** | 30K ohms. |
| Resistor **46** | 10K ohms. |
| Resistor **50** | 2.4K ohms. |
| Resistor **52** | 16K ohms. |
| Resistor **54** | 820 ohms. |
| Capacitor **56** | .001 μf. |
| Capacitor **58** | 33 μf. |
| Frequency of oscillations | 150 cycles per second. |

What has been described therefore is a system for synchronizing an oscillator such as a multivibrator wherein the synchronizing pulse is employed both to turn the multivibrator off for a given time period and to insure that the multivibrator will restart on the proper cycle at the end of the synchronizing pulse.

While the invention has been particularly shown and described with reference to a preferred embodiment thereof, it will be understood by those skilled in the art that various changes in form and details may be made therein without departing from the spirit and scope of the invention.

What is claimed is:

1. In a free running oscillator of the type including first and second transistors having collector, base and emitter electrodes and wherein the collector electrode of each transistor is connected to the base electrode of the other transistor by a capacitor, the first transistor being on and conducting when the second transistor is off and not conducting and the second transistor being on and conducting when the first transistor is off and not conducting, and wherein the collector electrode of the conducting transistor applies a voltage to the base electrode of the off transistor via the capacitor to enable the off transistor to turn on,
   - a synchronizing system comprising a source of synchronizing pulse,
   - a third transistor circuit coupled between the base eletcrode of said first transistor and said synchronizing pulse source and responsive to said pulse to provide a cut-off voltage to the base electrode of said first transistor and to provide a shunt path for the capacitor connected to the base electrode of said first transistor to maintain said first transistor in the off state for the duration of said synchronizing pulse,
   - and a fourth transistor circuit connected between said synchronizing pulse source and the collector electrode of said first transistor for varying the voltage of the collector electrode of said first transistor at the end of said synchronizing pulse to place said second transistor in the off state and said first transistor in the on state.

2. In a free running oscillator of the type including first and second transistors each having first, second, and third electrodes and wherein the first electrode of each transistor is connected to the second electrode of the other transistor by a capacitor, the first transistor being on and conducting when the second transistor is off and not conducting and the second transistor being on and conducting when the first transistor is off and not conducting, and wherein the first electrode of the conducting transistor applies a voltage to the second electrode of the off transistor via the capacitor to enable the off transistor to turn on, a synchronizing system comprising a source of synchronizing pulse, a third transistor circuit coupled between the second electrode of said first transistor and said synchronizing pulse source and responsive to said pulse to provide a cut-off voltage to the second electrode of said first transistor and to provide a shunt path for the capacitor connected to the second electrode of said first transistor to maintain said first transistor in the off state for the duration of said synchronizing pulse, and a fourth transistor circuit connected between said synchronizing pulse source and the first electrode of said first transistor for varying the voltage of the first electrode of said first transistor at the end of said synchronizing pulse to place said second transistor in the off state and said first transistor in the on state.

References Cited by the Examiner

UNITED STATES PATENTS

| | | | |
|---|---|---|---|
| 2,281,934 | 5/1942 | Geiger | 331—45 |
| 2,443,922 | 6/1948 | Moore | 331—145 |
| 2,949,582 | 8/1960 | Silliman | 331—113 |
| 3,133,257 | 5/1964 | Palmer et al. | 331—113 |

OTHER REFERENCES

Johnson: MV SYNC, IBM Tech. Bull., vol. 2, No. 4, page 90, December 1959.

ROY LAKE, *Primary Examiner.*

J. KOMINSKI, *Assistant Examiner.*